United States Patent
Kwon et al.

(10) Patent No.: US 11,622,489 B2
(45) Date of Patent: Apr. 4, 2023

(54) 3-D NAND CONTROL GATE ENHANCEMENT

(71) Applicant: Applied Materials, Inc., Santa Clara, CA (US)

(72) Inventors: Thomas Kwon, Dublin, CA (US); Xinhai Han, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/476,536

(22) Filed: Sep. 16, 2021

(65) Prior Publication Data

US 2022/0005815 A1  Jan. 6, 2022

Related U.S. Application Data

(62) Division of application No. 16/783,425, filed on Feb. 6, 2020, now Pat. No. 11,164,882.

(60) Provisional application No. 62/805,428, filed on Feb. 14, 2019.

(51) Int. Cl.
*H01L 21/28* (2006.01)
*H01L 29/423* (2006.01)

(52) U.S. Cl.
CPC ........ *H10B 41/35* (2023.02); *H01L 29/40114* (2019.08); *H01L 29/42324* (2013.01); *H10B 41/27* (2023.02)

(58) Field of Classification Search
CPC ............... H01L 29/40114; H01L 29/42324
See application file for complete search history.

(56) References Cited

U.S. PATENT DOCUMENTS 10,141,322 B2   11/2018   Simsek-Ege et al.
2015/0041879 A1  2/2015   Jayanti et al.
2015/0371709 A1 12/2015   Kai et al.

*Primary Examiner* — Errol V Fernandes
(74) *Attorney, Agent, or Firm* — Servilla Whitney LLC

(57) ABSTRACT

Methods of forming 3D NAND devices are discussed. Some embodiments form 3D NAND devices with a control gate and a floating gate disposed between a first insulating layer and a second insulating layer. A conformal blocking liner surrounds the floating gate and electrically isolates the control gate from the floating gate. Some embodiments form 3D NAND devices with decreased vertical and/or later pitch between cells.

9 Claims, 10 Drawing Sheets

US 11,622,489 B2

3-D NAND CONTROL GATE ENHANCEMENT

CROSS-REFERENCE TO RELATED APPLICATIONS

This application is a divisional of U.S. application Ser. No. 16/783,425, filed on Feb. 6, 2020, which claims priority to U.S. Provisional Application No. 62/805,428, filed Feb. 14, 2019, the entire disclosures of which are hereby incorporated by reference herein.

TECHNICAL FIELD

Embodiments of the present disclosure pertain to the field of electronic devices and methods and apparatus for manufacturing electronic devices. More particularly, embodiments of the disclosure provide NAND memory devices having a control gate and a floating gate.

BACKGROUND

Semiconductor technology has advanced at a rapid pace and device dimensions have shrunk with advancing technology to provide faster processing and storage per unit space. As semiconductor technology advances, the market demands increasing smaller chips with increasingly more structures per unit area. One class of devices which has seen many advances in miniaturization are memory devices. As the demand for higher density increases, the typical approach in 3D NAND devices has been to stack more layers. Yet additional layers result in thicker stacks which are increasingly difficult to etch due to increasing aspect ratios. Accordingly, one solution has been to decrease the vertical pitch between layers so that total stack height does not increase.

With thinner layers, however, cross-talk between neighboring cells has become an issue. Cross-talk can lead to poor device performance and largely defeat the benefits of the increased chip density. One way to reduce cross-talk is to increase the surface area of charge-trap layers. Therefore, there is a need for methods of increasing the surface area of charge-trap layers without increasing vertical pitch between cells.

For further scaling down for vertical pitch of 20 nm and less, current cell design of 3D NAND floating gate cells have device challenges to reduce cell to cell interference while managing a high coupling ratio between control gate to floating gate. Therefore, there is a need for improving cell functionality to reduce cell to cell interference in narrow pitch 3D NAND devices.

SUMMARY

Embodiments of the disclosure are directed to a NAND memory structure comprising: a control gate material and a floating gate material disposed between a first insulating layer and a second insulating layer, the floating gate material having a first side, a second side, a third side, and a fourth side, the second side facing the control gate material and the fourth side facing a memory hole channel; a conformal blocking oxide liner along the first side, the second side, and the third side of the floating gate material and along a face of the first and second insulating layers facing the memory hole channel, such that the conformal blocking oxide liner electrically isolates the control gate material from the floating gate material; a gate oxide material contacting the fourth side of the floating gate material and the conformal blocking oxide liner adjacent the face of the first and second insulating layers; and a silicon material on the gate oxide material, a surface of the silicon material facing the memory hole channel.

In one or more embodiments, a method of forming a NAND memory structure comprises depositing a plurality of alternating layers of a nitride material and an oxide material separated by a silicon layer; etching a memory hole through the plurality of alternating layers to form an exposed surface of the alternating layers; selectively etching a portion of the nitride material through the memory hole; depositing a blocking oxide layer in the memory hole to form a conformal oxide liner on the exposed surface of the alternating layers; depositing a floating gate metal into the memory hole to form a floating gate adjacent the conformal oxide liner; depositing a gate oxide material into the memory hole to form a layer of gate oxide material adjacent the floating gate; depositing a silicon material in the memory hole to form a silicon channel adjacent the layer of gate oxide material; removing the nitride material to expose the silicon layers and the conformal oxide liner to form a gap on an opposite side of the conformal oxide liner from the floating gate; removing the silicon layers to expose layers of oxide material; and depositing a metal gate material to fill the gap between layers of the oxide material.

In one or more embodiments, a processing tool comprises a central transfer station comprising a robot configured to move a wafer; plurality of process stations, each process station connected to the central transfer station and providing a processing region separated from processing regions of adjacent process stations, the plurality of process stations comprising a blocking oxide material deposition chamber; and a controller connected to the central transfer station and the plurality of process stations, the controller configured to activate the robot to move the wafer between process stations, and to control a process occurring in each of the process stations

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
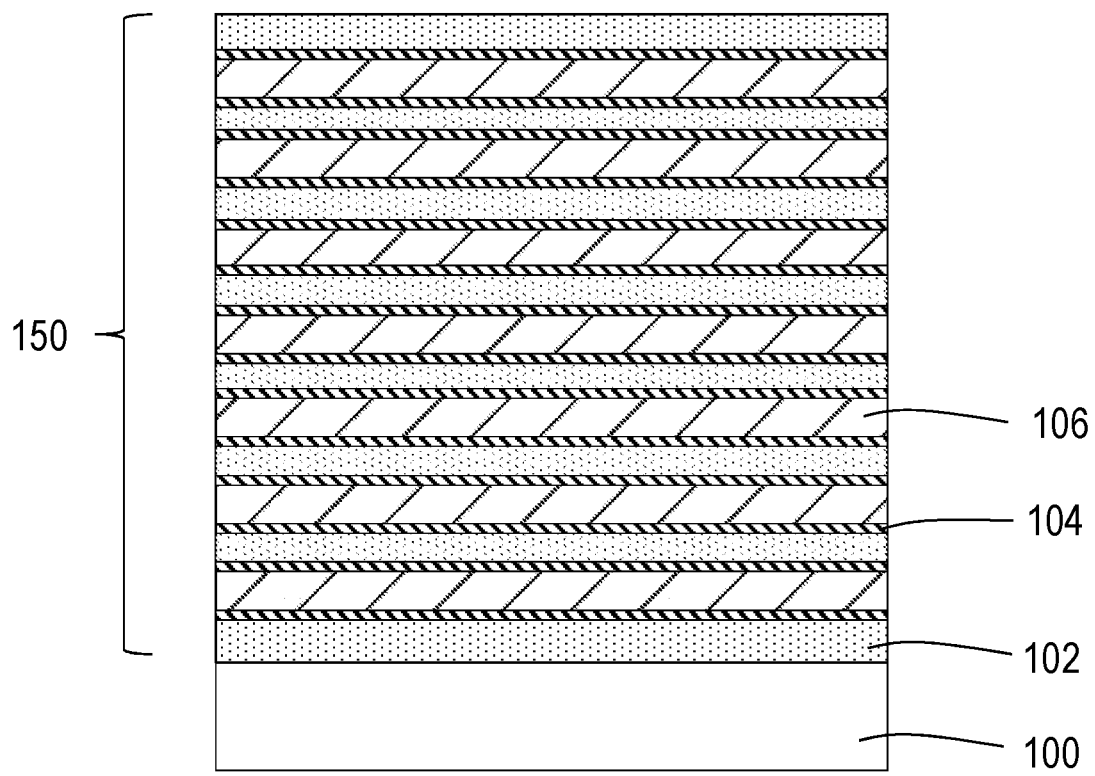
FIG. 1 illustrates a cross-sectional view of device according to one or more embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used herein, the term "3D NAND" refers to a type of electronic (solid-state) non-volatile computer storage memory in which the memory cells are stacked in multiple layers. 3D NAND memory generally includes a plurality of memory cells that include floating-gate transistors. Traditionally, 3D NAND memory cells include a plurality of NAND memory structures arranged in three dimensions around a bit line. A memory structure can include a floating gate that is electrically isolated from a supporting semiconductor substrate by a thin dielectric layer called a tunnel dielectric layer (i.e. tunnel oxide layer). A conductive material (i.e. a control gate) is positioned adjacent to the floating gate and electrically isolated therefrom by an inter-poly dielectric (IPD) layer. The inter-poly dielectric can be a layered structure, and can include a silicon nitride layer sandwiched between two layers of silicon oxide. The floating gate is comprised of a conductive material that serves as a charge storage element for electrical charge. This charge storage element defines the memory state of the particular transistor to which it is associated. The floating gate is electrically isolated from surrounding conductive materials, and the charge stored therein remains, even when power to the device is discontinued.

The current cell design of 3D NAND floating-gate devices is problematic in that cell to cell interference cannot be reduced while, at the same time, managing a high coupling ratio between the control gate (CG) and the floating-gate (FG). Accordingly, one or more embodiments advantageously provide a 3D NAND device having 20 nm or less of vertical pitch, less memory hole etching, and high cell functionality with reduced cell to cell interference.

The disclosure herein utilizes terms such as "vertical", "horizontal", "lateral" and the like. As used herein, "vertical" refers to the plane which extends from close to the substrate to a point or plane distant from the substrate. As illustrated in the attached figures, the vertical plane runs from the top of the 3D NAND device (top of the page) to the substrate (bottom of the page). Similarly, "horizontal" refers to the plane which extends from one side of the substrate to the other. As illustrated in the attached figures, the horizontal plane runs from the left of the 3D NAND device (left of the page) to the right of the 3D NAND device (right of the page). Accordingly, "lateral" should be understood as moving from left to right or vice versa, i.e. horizontally. The skilled artisan will recognize that the directional descriptions are relative to the orientation of the 3D NAND device and are not limited to any particular substrate orientation.

As used in this specification and the appended claims, the term "selectively" refers to process which acts on a first surface with a greater effect than another second surface. Such a process would be described as acting "selectively" on the first surface over the second surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

Referring to the Figures, some embodiments of the disclosure relate to methods for forming 3D NAND devices. FIG. 1 illustrates a cross-sectional view of an exemplary substrate 100 according to some embodiments of this disclosure. The methods begin by providing a substrate 100 to a processing chamber. A plurality of alternating layers 150 of a nitride material 102 and an oxide material 106 are deposited on the substrate 100. In one or more embodiments, as shown, the alternating layers 150 are separated by a silicon layer 104 between each layer of nitride material 106 and oxide material 102.

In one or more embodiments, the nitride material 106 comprises silicon nitride. In one or more embodiments, the oxide material 102 comprises silicon oxide. In one or more embodiments, the silicon layer 104 consists essentially of silicon. As will be understood by one skilled in the art, each of the nitride material 106 and the oxide material 102 may be stoichiometric or non-stoichiometric materials. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, tungsten oxide, zirconium oxide, aluminum oxide, hafnium oxide, and the like.

The alternating layers 150, including the nitride material 106, the oxide material 102, and/or the silicon layers 104 may be deposited by any suitable process known to the skilled artisan, including, but not limited to, atomic layer deposition, physical vapor deposition, or chemical vapor deposition. In one or more embodiments, each of the nitride material 106, the oxide material 102, and the silicon layers 104 are deposited by chemical vapor deposition.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

In one or more embodiments, the individual alternating layers may be formed to any suitable thickness. In one or more embodiments, the thickness of each layer of nitride material 106 is approximately equal. In one or more embodiments, the thickness of each layer of oxide material 102 is approximately equal. In one or more embodiments, the thickness of each silicon layer 104 is approximately equal. As used in this regard, thicknesses which are approximately equal are within +/−5% of each other.

In one or more embodiments, the average thickness of the layers of nitride material 106 is approximately equal to the average thickness of the layers of oxide material 102. In one or more embodiments, the average thickness of the layers of nitride material 106 is greater than or less than the average thickness of the layers of oxide material 102.

In one or more embodiments, a silicon layer 104 is deposited on each layer of nitride material 106 and each layer of oxide material 102. Stated differently, in one or more embodiments, a silicon layer 104 is deposited between a layer of nitride material 106 and a layer of oxide material 102.

In one or more embodiments, the thickness of the silicon layer 104 may be relatively thin when compared to the thickness of a layer of nitride material 106 or a layer of oxide material 102. In one or more embodiments, the thickness of the silicon layer 104 is less than or equal to about 20%, less than or equal to about 10%, less than or equal to about 5%, less than or equal to about 2%, or less than or equal to about 1% of the average thickness of the layers of nitride material 106 and oxide material 102.

In one or more embodiments, the average thickness of the layer of nitride material 106 is in a range of about 10 nm to about 50 nm, including about 15 nm to about 40 nm, about 17 nm to about 35 nm, or about 20 nm to about 20 nm. In one or more embodiments, the average thickness of the layers of nitride material 106 is about 27 nm. In one or more embodiments, the average thickness of the layers of oxide material 102 is in a range of about 10 nm to about 50 nm, including about 15 nm to about 40 nm, about 17 nm to about 35 nm, or about 20 nm to about 20 nm. In one or more embodiments, the average thickness of the layers of oxide material 102 is about 25 nm. one or more embodiments, the average thickness of the silicon layer 104 is in a range of about 1 nm to about 10 nm, include about 2 nm, about 3 nm, about 4 nm, about 5 nm, about 6 nm, about 7 nm, about 8 nm, or about 9 nm. In one or more embodiments, the average thickness of a silicon layer 104 is about 3 nm.

Figure 2:
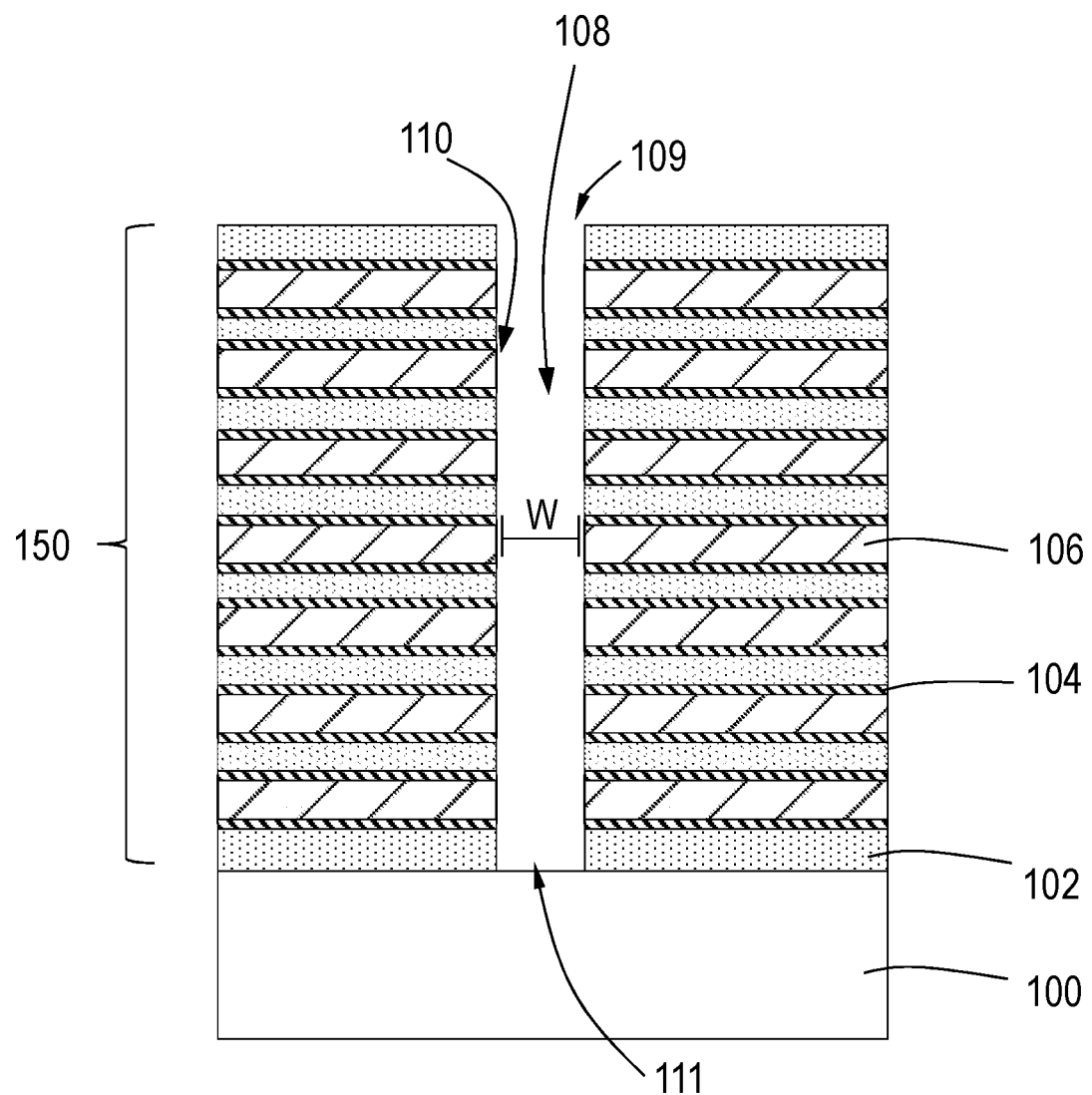
FIG. 2 illustrates a cross-sectional view of device according to one or more embodiments described herein.

With reference to FIG. 2, after the alternating layers 150 are deposited, a memory hole 108 is etched through the alternating layers 150. Etching the memory hole 108 forms an exposed surface 110 of the alternating layers 150. The memory hole 108 has a width W. In one or more embodiments, the width is approximately equal at the top 109 and bottom 111 of the memory hole 108. In one or more embodiments, the memory hole 108 has a width W in a range of about 25 nm to about 100 nm, including about 30 nm to about 80 nm, about 40 nm to about 75 nm, or about 50 nm to about 75 nm. In one or more embodiments, the memory hole 108 has a width W of about 70 nm.

In one or more embodiments, the memory hole 108 is formed using a hardmask. In one or more embodiments, etching the memory hole is performed using a reactive ion etch process.

Figure 3:
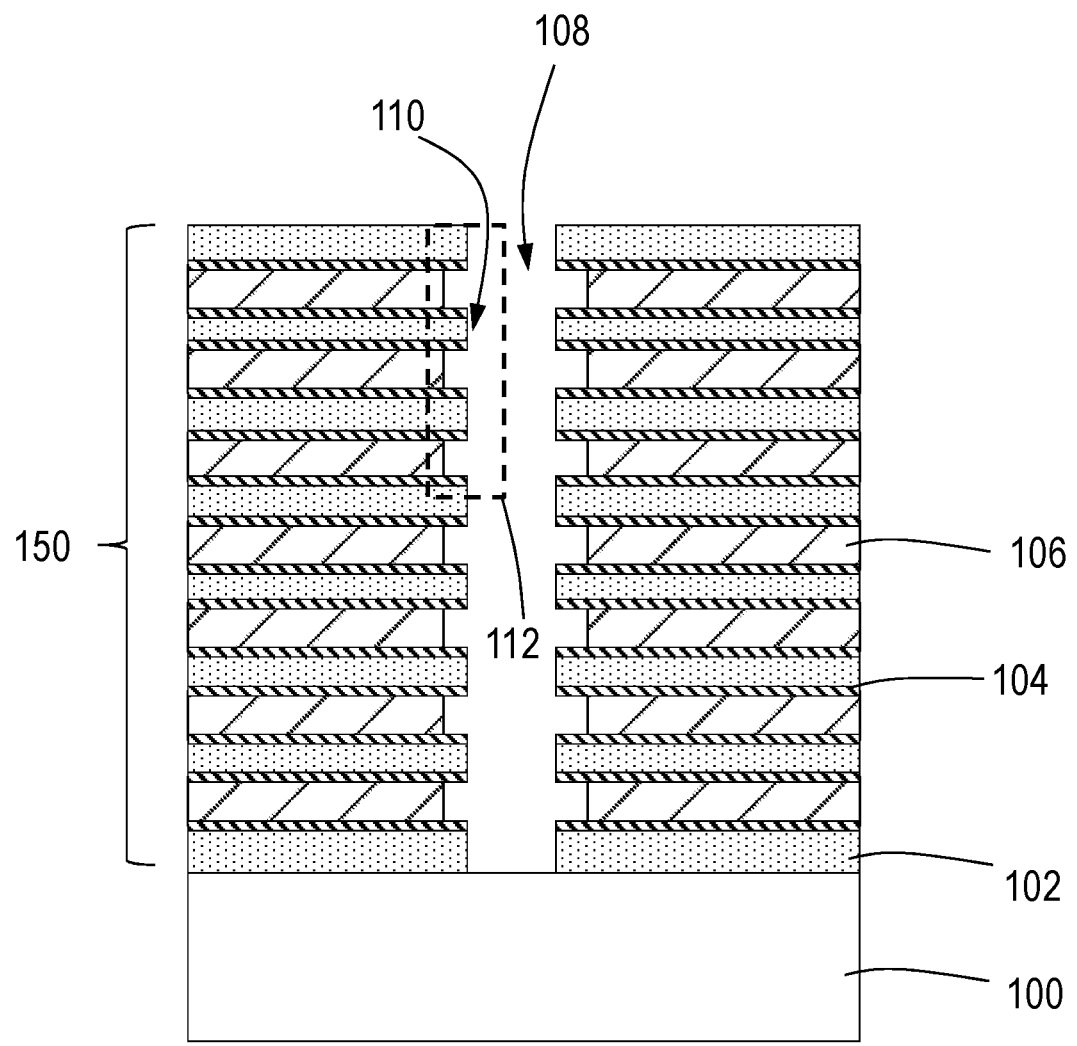
FIG. 3 illustrates a cross-sectional view of device according to one or more embodiments described herein.

As shown in FIG. 3, in one or more embodiments, after etching the memory hole 108, the layers of nitride material 106 are selectively etched through the memory hole 108 from the exposed surface 110 of the alternating layers 150. Etching the nitride material 106 laterally removes a portion of the nitride material 106.

In one or more embodiments, the amount of nitride material 106 removed may be controlled. In one or more embodiments, the nitride material 106 is selectively etched to remove a predetermined depth D of nitride material 106. As shown in FIG. 3, in one or more embodiments, the depth D of material removed from each layer of nitride material 106 is approximately equal.

In one or more embodiments, the nitride material 106 may be selectively etched by any suitable process selective to the oxide material 102 and the silicon layer 104. In one or more embodiments, the nitride material may be selectively etched by an atomic layer etching process.

In one or more embodiments, the nitride material 106 is selectively etched to remove a depth D that is proportional to the width W of the memory hole 108. In one or more embodiments, the depth D is greater than or equal to about 2% of W, greater than or equal to about 5% of W, greater than or equal to about 10% of W, or greater than or equal to about 15% of W. In one or more embodiments, the depth D is less than or equal to about 30% of W, less than or equal to about 25% of W, less than or equal to about 20% of W, less than or equal to about 15% of W, or less than or equal to about 10% of W. In one or more embodiments, the depth D is in a range of about 2% to about 30% of W, in a range of about 5% to about 25% of W, or in a range of about 10% to about 20% of W.

In one or more embodiments, the nitride material 106 is selectively etched to remove a predetermined depth D. In one or more embodiments, the depth D is less than or equal to about 10 nm, less than or equal to about 7 nm, less than or equal to about 5 nm, or less than or equal to about 3 nm. In one or more embodiments, the depth D is in a range of about 2 nm to about 10 nm or in a range of about 10 nm to about 15 nm. In one or more embodiments, the depth D is about 5 nm.

Figure 4:
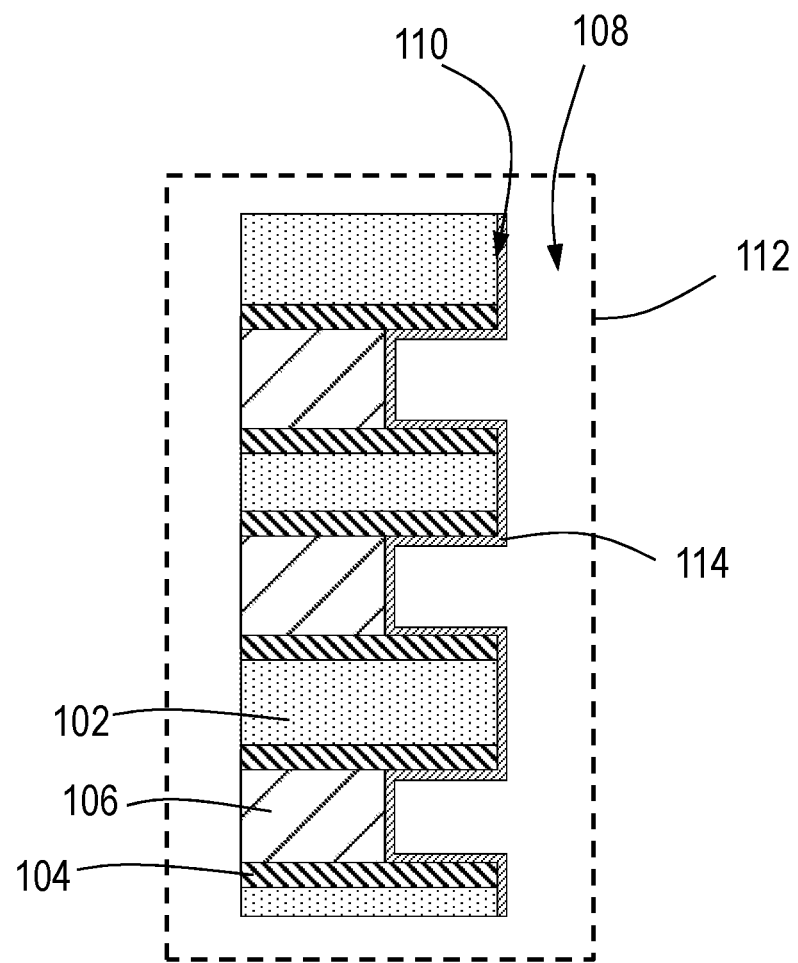
FIG. 4 illustrates an enlarged cross-sectional view of the device according to one or more embodiments described herein.

FIG. 4 shows an enlarged view of region 112 shown in FIG. 3 after, in one or more embodiments, a blocking oxide material is deposited in the memory hole 108 to form a conformal blocking oxide liner 114 on the exposed surface 110 of the alternating layers 150. In one or more embodiments, the conformal blocking oxide liner 114 has a first side and a second side. In one or more embodiments, the first side of the conformal blocking oxide liner 114 is adjacent to the alternating layers 150 of nitride material 106 and the oxide material 102 and silicon layer 104. In one or more embodiments, the second side of the conformal blocking oxide liner 114 is adjacent the memory hole 108.

In one or more embodiments, the conformal blocking oxide liner 114 is deposited by atomic layer deposition. In one or more embodiments, the atomic layer deposition process is a spatial atomic layer deposition process. The blocking oxide liner 114 may comprise any acceptable material known to one of skill in the art. In one or more embodiments, the blocking oxide liner 114 comprises a material selected from aluminum oxide ($Al_2O_3$), silicon oxide (SiO), silicon nitride (SiN), silicon oxynitride (SiON), and combinations thereof, including, but not limited to, silicon oxide-silicon nitride (SiO—SiN) or aluminum oxide-silicon oxide nitride (AlO—SiON).

In one or more embodiments, the conformal blocking oxide liner 114 is substantially conformal to the exposed surface 110 of the alternating layers 150. As used herein, a layer which is "substantially conformal" refers to a layer where the thickness is about the same throughout (e.g., on the top, middle and bottom of sidewalls and on the bottom of the gap). A layer which is substantially conformal varies in thickness by less than or equal to about 5%, 2%, 1% or 0.5%.

Without being bound by theory, it is believed that recessing the nitride material 106 provides a structure with variable depth such that when the conformal blocking oxide liner 114 is deposited, the conformal blocking oxide liner 114 has a greater surface area in proximity to the nitride material 106 than a similar process performed on a structure without the variable depth. In theory, the increased surface area of the conformal blocking oxide liner 114 provides several benefits.

In one or more embodiments, recessing the nitride material 106 by about 5 nm allows for the vertical pitch between similar layers (i.e. between two oxide layers or two gate layers) to be reduced by about 25%. In one or more embodiments, recessing the nitride material 106 by about 5 nm allows the width W of the memory hole to be reduced by about 25%. Reducing the width W of the memory hole 108 allows for the lateral pitch between cells to be reduced by a similar amount. In one or more embodiments, reducing the width W of the memory hole 108 provides lower pass voltage. In one or more embodiments, the conformal blocking oxide liner 114 and related increased surface area provides for higher charge retention.

Figure 5:
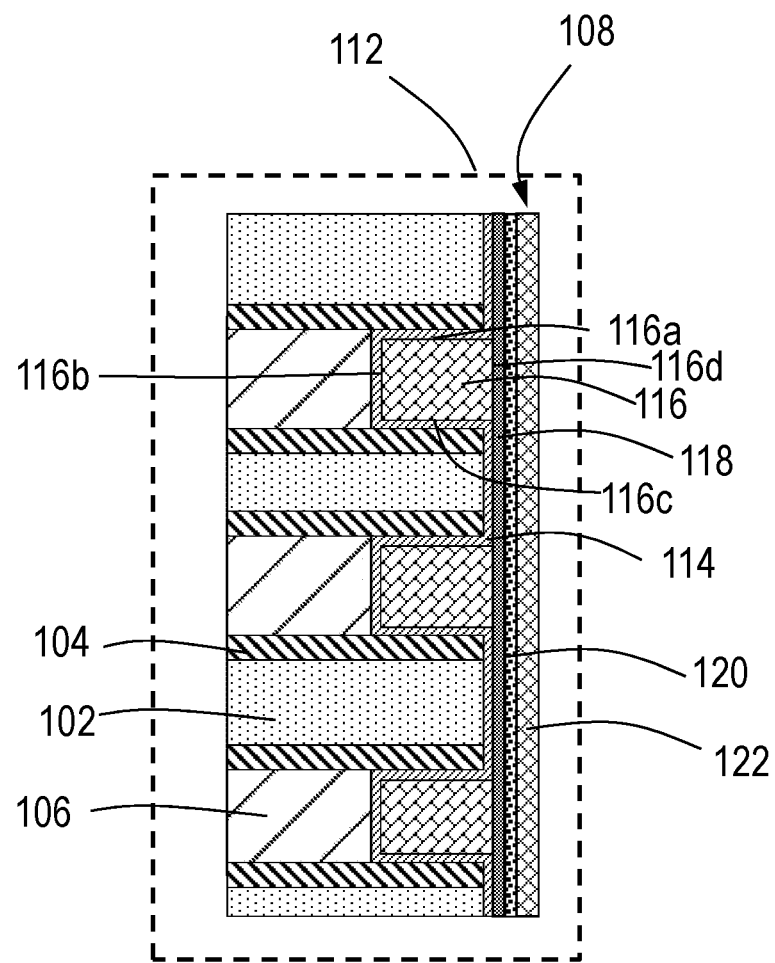
FIG. 5 illustrates an enlarged cross-sectional view of the device according to one or more embodiments described herein.

As shown in FIG. 5, after depositing conformal blocking oxide liner 114, a floating gate material is deposited to fill the memory hole 108. As understood by one of skill in the art, any overburden created by filling the memory hole 108 with a floating gate material is then removed to form a floating gate 116. The overburden of floating gate material may be removed by any technique known to one of skill in the art, including but not limited to, chemical mechanical planarization or etching.

In one or more embodiments, the floating gate 116 has four sides, a first side 116a, a second side 116b, a third side 116c, and a fourth side 116d. In one or more embodiments, the conformal oxide liner 114 surrounds the floating gate 116 on the first side 116a, the second side 116b, and the third side 116c, while the fourth side 116a of the floating gate 116 faces the memory hole 108. In one or more embodiments, the floating gate 116 comprises one or more of tungsten (W), copper (Cu), cobalt (Co), aluminum (Al), ruthenium (Ru), iridium (Ir), molybdenum (Mo), platinum (Pt), tantalum (Ta), titanium (Ti), or rhodium (Rh).

In one or more embodiments, after forming the floating gate, a gate oxide material is deposited in the memory hole 108 to form a layer of gate oxide material 118 adjacent the floating gate 116 and contacting the fourth side 116d of the floating gate 116. The layer of gate oxide material 118 may be deposited by any technique known to the skilled artisan. In one or more embodiments, the gate oxide 118 has a first side contacting the fourth side 116d of the floating gate 116 and the conformal blocking oxide liner 114 adjacent the face of the oxide material 102 and the silicon layer 104.

In one or more embodiments, the gate oxide material 118 comprises one or more of silicon oxynitride (SiON), silicon oxide, or a high-K dielectric material.

In one or more embodiments, after the layer of gate oxide material 118 is formed, a silicon material is deposited in the memory hole 108 to form a silicon channel 120. In one or more embodiments, the silicon material comprises an amorphous silicon or poly-silicon. In one or more embodiments, the silicon channel 120 has a first side contacting the gate oxide 118 and a second side facing the memory hole 108.

The silicon material may be deposited by any suitable process. In one or more embodiments, the silicon material to form the silicon channel 120 is deposited by chemical vapor deposition (CVD). In one or more embodiments, the silicon material to form the silicon channel 120 is deposited by epitaxial deposition. In one or more embodiments, the silicon material to form the silicon channel 120 is deposited by a flowable CVD process.

While not illustrated in the figures, after forming the silicon channel 120, a slit is opened on the opposite side of the alternating layers 150 from the memory hole 108. In one or more embodiments, the slit is formed using a hardmask. In one or more embodiments, etching the slit is performed using a reactive ion etch process. In one or more embodiments, the slit is formed by a similar process to the process used to etch the memory hole 108.

Figure 6:
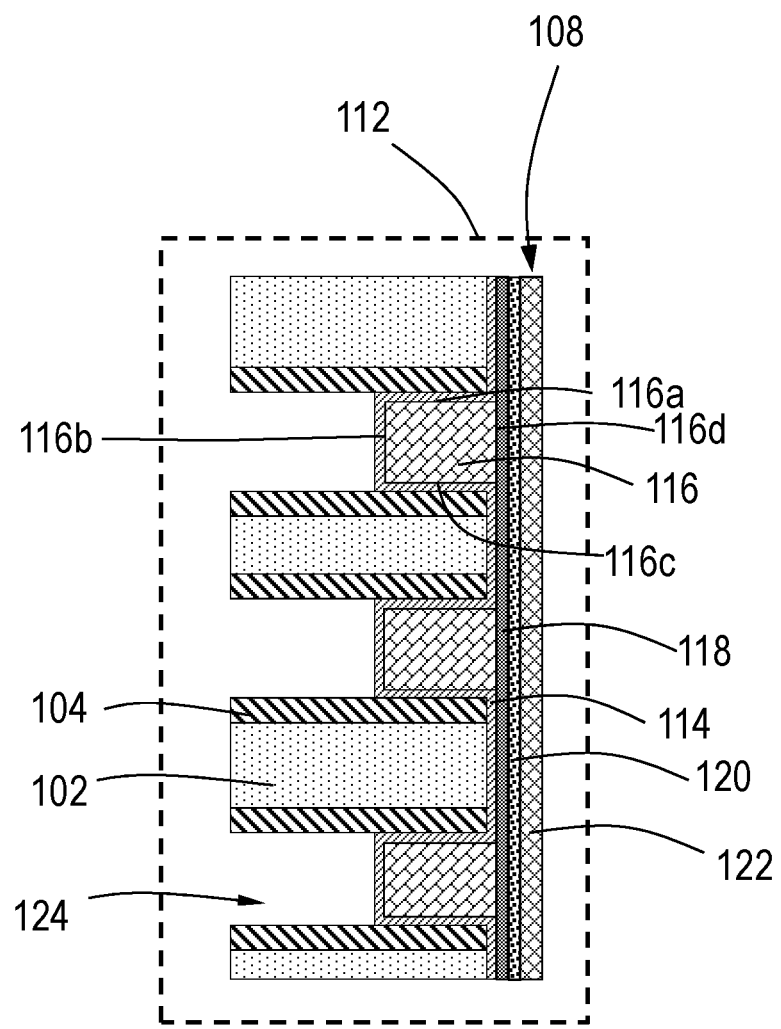
FIG. 6 illustrates an enlarged cross-sectional view of the device according to one or more embodiments described herein.

As shown in FIG. 6, after forming the slit, the nitride material 106 is removed to expose the silicon layers 104 and the conformal blocking oxide liner 114 to form a gap 124 on the opposite side of the conformal blocking oxide line 114 from the floating gate 116. The nitride material 106 may be removed by any suitable process. In one or more embodiments, the removal process is selective to the nitride material 106 over the silicon layers 104, the conformal blocking liner 114, and/or the oxide material 102. In one or more embodiments, the nitride material 106 is removed using hot phosphoric acid (hot phos).

Figure 7:
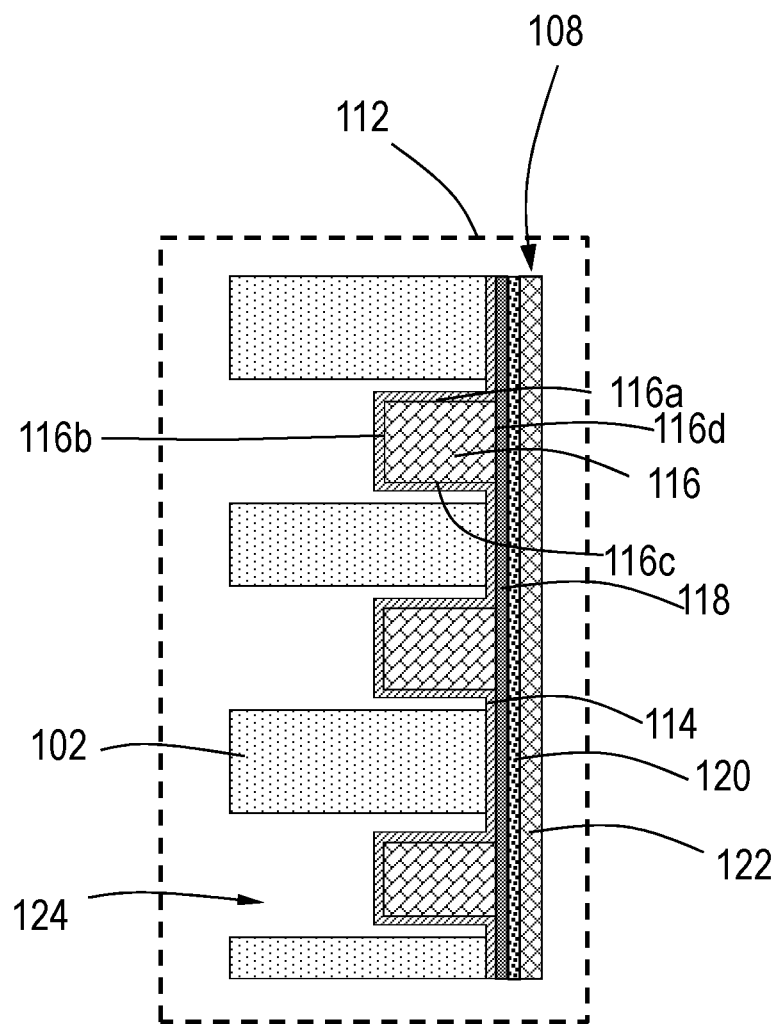
FIG. 7 illustrates an enlarged cross-sectional view of the device according to one or more embodiments described herein.

With reference to FIG. 7, in one or more embodiments, after removing the nitride material 106, the silicon layers 104 (if present) are removed. The silicon layers 104 may be removed by any suitable process known to the skilled artisan. In one or more embodiments, the removal process is selective to the silicon layers 104 over the oxide material 102 and/or the conformal blocking liner 114. In one or more embodiments, the silicon layers 104 are removed using potassium hydroxide.

Figure 8:
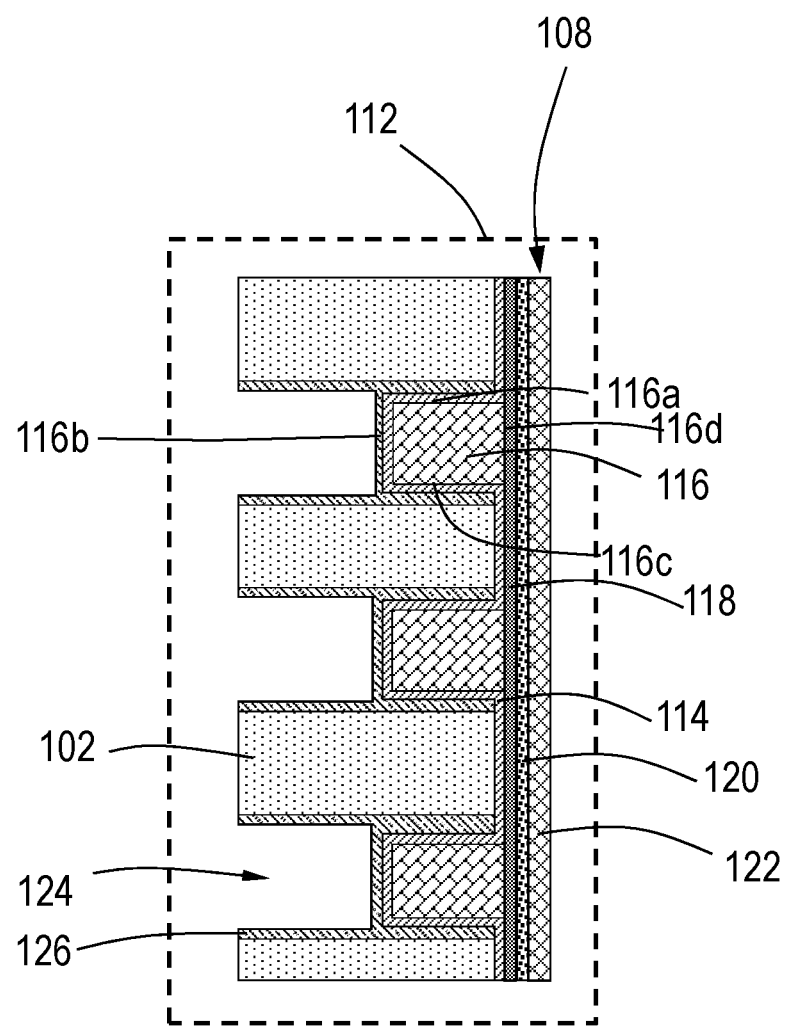
FIG. 8 illustrates an enlarged cross-sectional view of the device according to one or more embodiments described herein.

With reference to FIG. 8, in one or more embodiments, after removing the silicon layers 104, if necessary, a barrier layer 126 may be deposited on the layers of oxide material 102. In one or more embodiments, the barrier layer 126 is not deposited. In one or more embodiments, the barrier layer 126 is deposited by atomic layer deposition. In one or more embodiments, the barrier layer 126 comprises one or more of titanium nitride (TiN), tantalum nitride (TaN).

Figure 9:
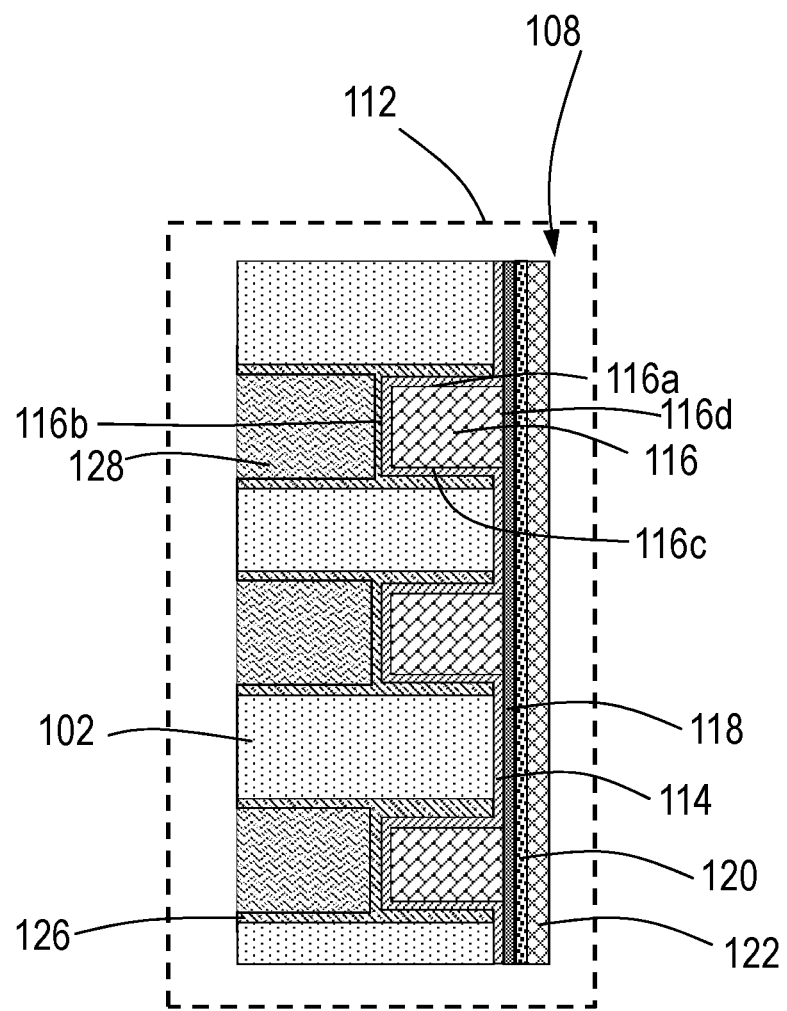
FIG. 9 illustrates an enlarged cross-sectional view of the device according to one or more embodiments described herein.

With reference to FIG. 9, in one or more embodiments, a metal gate material is deposited to fill the gaps 124 between the layers of oxide material 102 and form a control gate 128. The control gate 128 may be any suitable conductive material known to the skilled artisan. In one or more embodiments, the control gate material comprises one or more of tungsten (W), copper (Cu), cobalt (Co), aluminum (Al), ruthenium (Ru), iridium (Ir), molybdenum (Mo), platinum (Pt), tantalum (Ta), titanium (Ti), or rhodium (Rh). In one or more embodiments, the control gate material 128 comprises tungsten (W). In one or more embodiments, the control gate material 128 is deposited by atomic layer deposition. In one or more embodiments, not shown, the layers of control gate material 128 formed join together. In these embodiments, the layers of control gate material 128 may be separated by a selective atomic level metal etch process.

One or more embodiments are directed to a NAND memory structure comprising a control gate material 128 and a floating gate material 116 disposed between a first insulating layer 102 (e.g. oxide layer 102) and a second insulating layer 120 (e.g. oxide layer 102), the floating gate material 116 having a first side 116a, a second side 116b, a third side 116c, and a fourth side 116d, the second side 116b facing the control gate material 128 and the fourth side 116d facing a memory hole channel 108. In one or more embodiments, the NAND memory structure comprises a conformal blocking oxide liner 114 along the first side 116a, the second side 116b, and the third side 116c of the floating gate material 116 and along a face of the first and second insulating layers 102 facing the memory hole channel 108, such that the conformal blocking oxide liner 114 electrically isolates the control gate material 128 from the floating gate material 116. In one or more embodiments, the NAND memory structure comprises a gate oxide material 118 contacting the fourth side 116a of the floating gate material 116 and the conformal blocking oxide liner 114 adjacent the face of the first and second insulating layers 102; and a silicon material 120 on the gate oxide material 118, a surface of the silicon material 120 facing the memory hole channel 108.

One or more embodiments are directed to a 3D NAND memory comprising a plurality of the NAND memory structures of one or more embodiments arranged in a three-dimensional configuration around the memory hole channel 108. In some embodiments, the 3D NAND memory cell comprises a bit line in the memory hole channel 108 contacting the silicon material 120.

Figure 10:
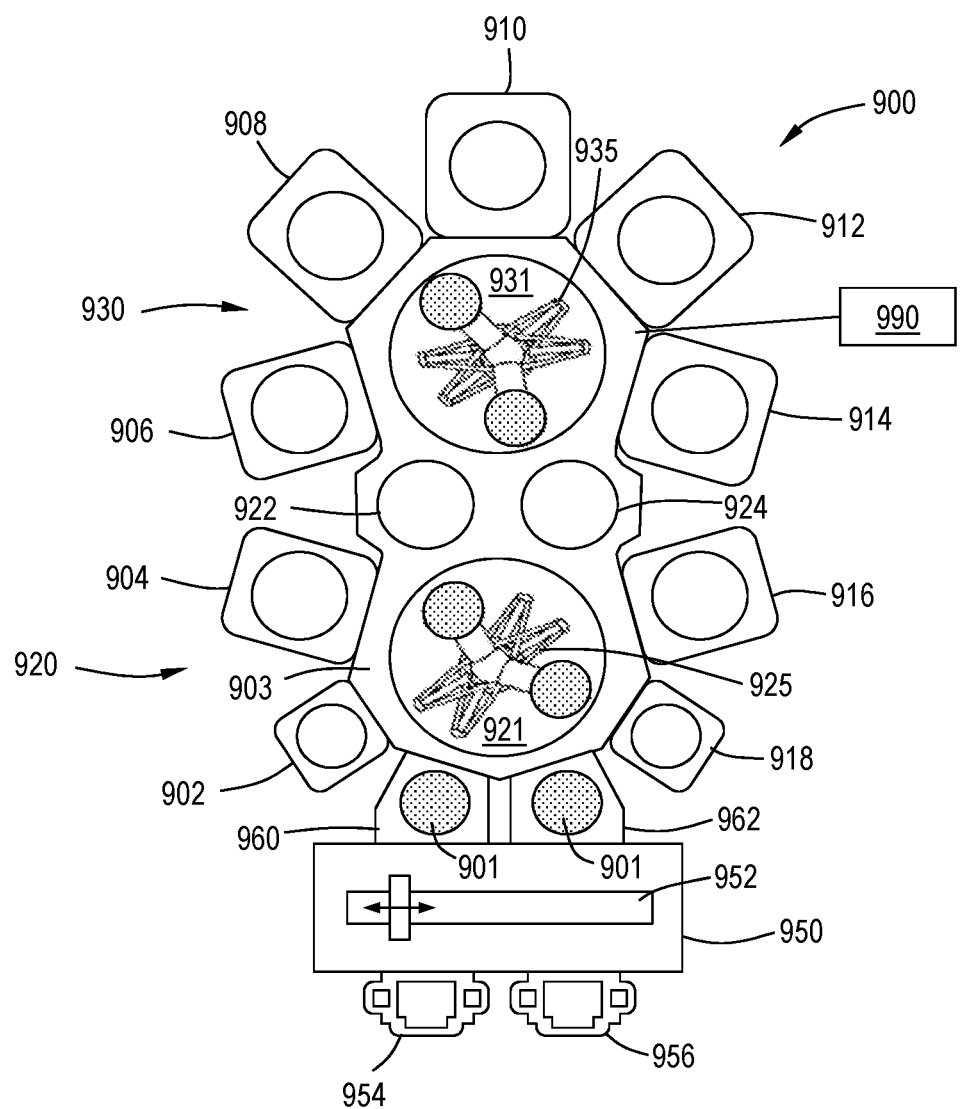
FIG. 10 illustrates a cluster tool according to one or more embodiments.

Additional embodiments of the disclosure are directed to processing tools 900 for the formation of the memory devices and methods described, as shown in FIG. 10.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber and a blocking oxide material deposition chamber. The particular arrangement of process chambers and components can be varied depending on the cluster tool and should not be taken as limiting the scope of the disclosure.

In one or more embodiments, the cluster tool 900 includes a blocking oxide material deposition chamber. The a blocking oxide material deposition chamber of some embodiments comprises one or more of an atomic layer deposition chamber, a plasma enhanced atomic layer deposition chamber, a chemical vapor deposition chamber, a plasma enhanced chemical vapor deposition chamber, a spatial atomic layer deposition chamber, or a physical deposition chamber. In one or more embodiments, the cluster tool 900 includes a pre-cleaning chamber connected to the central transfer station.

In the embodiment shown in FIG. 10, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a NAND memory structure, the method comprising:
   depositing a plurality of alternating layers of a nitride material and an oxide material separated by a silicon layer;
   etching a memory hole through the plurality of alternating layers to form an exposed surface of the plurality of alternating layers;
   selectively etching laterally through the memory hole from the exposed surface a portion of the nitride material;
   depositing a blocking oxide layer in the memory hole to form a conformal oxide liner on the exposed surface of the plurality of alternating layers, the conformal oxide layer having a first side adjacent to the plurality of alternating layers of nitride material and oxide material, and second adjacent to the memory hole;
   depositing a floating gate metal into the memory hole to form a floating gate adjacent the conformal oxide liner, the floating gate material having a first side, a second side, a third side, and a fourth side, the conformal oxide layer surrounding the floating gate on the first side, the second, side, and the third side, and the fourth side facing the memory hole channel;
   depositing a gate oxide material into the memory hole to form a layer of gate oxide material adjacent the floating gate, the gate oxide material conformally extending along the fourth side of the floating gate material and conformally extending along the conformal blocking oxide liner adjacent the face of the first and second insulating layers facing the memory hole channel;
   depositing a silicon material in the memory hole to form a silicon channel adjacent the layer of gate oxide material;
   removing the nitride material to expose the silicon layers and the conformal oxide liner to form a gap on an opposite side of the conformal oxide liner from the floating gate;
   removing the silicon layers to expose layers of oxide material; and
   depositing a metal gate material to fill the gap between layers of the oxide material.

2. The method of claim 1, wherein the memory hole has a width in a range of about 50 nm to about 100 nm.

3. The method of claim 1, wherein selectively etching a portion of the nitride material comprises an atomic layer etching process.

4. The method of claim 1, wherein the nitride material is etched to remove a depth in a range of about 10% to about 20% of the width of the memory hole.

5. The method of claim 1, wherein the conformal oxide liner is deposited by a spatial atomic layer deposition process.

6. The method of claim 1, wherein the nitride material is removed by hot phosphoric acid.

7. The method of claim 1, wherein the silicon layers are removed by potassium hydroxide.

8. The method of claim 1, further comprising depositing a barrier layer on the layers of oxide material after the silicon layers are removed so that the metal gate material is deposited on the barrier layer.

9. The method of claim 8, wherein the barrier layer comprises one or more of TiN, or TaN.

* * * * *